US006988375B2

(12) United States Patent
Bashark

(10) Patent No.: US 6,988,375 B2
(45) Date of Patent: Jan. 24, 2006

(54) SYSTEM AND METHOD FOR REMOTE APPLIANCE MONITORING

(75) Inventor: Larry T. Bashark, St. Joseph, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 120 days.

(21) Appl. No.: 10/457,739

(22) Filed: Jun. 9, 2003

(65) Prior Publication Data

US 2004/0244390 A1 Dec. 9, 2004

(51) Int. Cl.
*F25B 49/00* (2006.01)
*F26B 19/00* (2006.01)
*D06F 33/00* (2006.01)

(52) U.S. Cl. .............................. 62/127; 62/230; 34/553; 34/554; 68/12.16; 68/12.17

(58) Field of Classification Search .................. 62/125, 62/126, 127, 129, 130, 131, 230; 361/22, 361/25, 30, 31; 318/438, 729; 340/584, 340/585, 597, 593, 595; 34/549, 553, 554; 68/12.16, 12.17
See application file for complete search history.

(56) References Cited

U.S. PATENT DOCUMENTS

| | | | |
|---|---|---|---|
| 4,307,775 A * | 12/1981 | Saunders et al. | 62/127 |
| 4,481,786 A | 11/1984 | Bashark | 62/160 |
| 4,724,678 A * | 2/1988 | Pohl | 62/80 |
| 5,006,778 A | 4/1991 | Bashark | 318/799 |
| 5,038,091 A | 8/1991 | Bashark | 318/809 |
| 5,101,575 A | 4/1992 | Bashark | 34/53 |
| 5,130,624 A | 7/1992 | Bashark | 318/280 |
| 5,166,592 A | 11/1992 | Bashark | 318/799 |
| 5,237,256 A | 8/1993 | Bashark | 318/817 |
| 5,280,227 A | 1/1994 | Bashark | 318/751 |
| 5,281,956 A | 1/1994 | Bashark | 340/660 |
| 5,564,831 A | 10/1996 | Bashark | 374/141 |
| 6,564,568 B1 * | 5/2003 | Shen | 62/230 |

* cited by examiner

Primary Examiner—Harry B. Tanner
(74) Attorney, Agent, or Firm—Stephen Krefman; Robert O. Rice; John F. Colligan

(57) ABSTRACT

A device is provided for monitoring a plurality of appliances, wherein each appliance is connected to an electrical circuit having a first wire and a second wire. The device includes a plurality of cores, each of the plurality of cores being constructed to be able to surround one of the first wires of each circuit and having a secondary winding at which an electrical signal is generated in response to a current polarity change in the first wire. A multiplexer is connected to the secondary winding of each of the plurality of cores. A processor is connected to the multiplexer to monitor the phase relationship between an AC voltage an AC current of each appliance connected to one of the plurality of circuits and to determine information relating to the function of the appliance based on the phase relationship. The device may be located at the circuit breaker box of an establishment.

31 Claims, 5 Drawing Sheets

SYSTEM AND METHOD FOR REMOTE APPLIANCE MONITORING

BACKGROUND OF THE INVENTION

Various control and monitoring systems for appliances have previously been disclosed in prior patents by the inventor of the present invention. In particular, U.S. Pat. No. 4,481,786 discloses an electronic control for an electronic appliance. The control has a ferrite core which surrounds the run winding for the drive motor of the appliance. The run winding represents the primary winding for the ferrite core, which has a secondary winding at which a brief output voltage is generated whenever the run winding current changes direction. This sensor in combination with a voltage zero cross detector circuit and post-connected logic circuitry generates a voltage pulse and a phase pulse which are respectively related to the voltage level of the drive motor and the motor output torque which is required to operate a movable member in the appliance. A microcomputer is then utilized to generate a representative digital phase number which corresponds to the torque expended in the appliance. The phase number is utilized in various programs of the microcomputer for automatically controlling various functions of the appliance as well as other events in an operational sequence upon the attainment of selected torque levels.

U.S. Pat. Nos. 5,006,778 and 5,166,592 disclose a motor diagnostics and electronic controller for a clothes dryer. The controller includes a single sense-winding that is threaded through sensors monitoring drive motor current and heater current, and that generates an output voltage each time the alternating motor or heater current passes through a zero-crossing. The control monitors the ON/OFF condition of the heater and samples the lagging phase angle of the motor current, to provide an improved means of detecting when the clothes load is dry by measuring variation in motor torque due to minute differences in the way that the clothes load is tumbling from one drum revolution to the next revolution, ignoring cyclical, repetitive variation due to uneven drum rotational friction. Numerous diagnostic conditions are also monitored at the start of each cycle, or, throughout each cycle, including: 208 or 240 VAC service voltage identification; motor start detection; drum acceleration detection; empty drum or drying rack detection; motor or heater open/short circuit detection; open door detection; broken belt detection; and restricted air flow detection.

U.S. Pat. Nos. 5,101,575 and 5,281,956 disclose a heater diagnostics and electronic control for a clothes dryer. The control monitors the ON/OFF condition of the heater and samples the lagging phase angle of the motor current, and provides an improved means of detecting when the clothes load is dry. Numerous heater related diagnostic conditions are also monitored at the start of each cycle, or, throughout each cycle, including: heater ground fault detection; 208 or 240 VAC service voltage identification; heater open/short circuit detection; open door detection; heater box thermostat cycling; and restricted air flow detection.

U.S. Pat. Nos. 5,130,624 and 5,237,256 disclose an electronic control for an automatic washing machine with a reversing PSC (Permanent Split Capacitor) motor. The control includes separate ferrite core sensors surrounding each of two PSC motor windings. A sense-winding is threaded through both sensors. A brief output voltage is generated whenever the alternating current in either PSC motor winding passes through a zero-crossing and when the sense-winding is wound with proper mutual polarity, an output voltage is generated in response to zero-crossings of a brief, residual alternating current which flows in both PSC motor windings and the motor capacitor when the rotating PSC motor is cycled OFF. The circuitry, in combination with the sensors, samples the leading or lagging phase angle of the PSC motor auxiliary or main winding, respectively, at a sample rate of two-times the line frequency when the PSC motor is ON; and further monitors the PSC motor braking phenomena by counting the residual current alternations when the PSC motor is cycled OFF following the powered portion of each CW or CCW agitator stroke. The raw PSC motor phase data is used in microcomputer programs to compute motor start time or load torque dither. This computed information and the PSC motor braking data, is used by other software programs to automatically control various functions of the washing machine such as the fill water level and agitator stroke angle; to control events in an operational sequence such as the duration of the agitation and spin operations; and to provide diagnostic information such as spin off-balance detection.

U.S. Pat. Nos. 5,038,091 and 5,280,227 disclose a control for a domestic refuse compactor which permits the user to control the approximate full trash bag weight and obtain more compaction from a split phase induction drive motor. A ferrite core sensor on the main winding of the drive motor samples the lagging phase angle of the motor main winding current during a compaction stroke. A low force cycle is achieved by terminating the stroke as soon as phase samples fall below a threshold defined at the start of each cycle by a locked motor main winding phase sample acquired prior to starting the motor. A medium force cycle terminates the stroke when compaction forces exceed the main winding breakdown torque. A high force cycle is achieved by re-activating a motor start winding when compaction forces exceed the main winding breakdown torque and terminating the stroke as soon as the phase samples exceed a threshold defined at the start of each cycle during motor starting. The control uses programmed referencing techniques to eliminate factory pre-calibration.

Each of the prior art designs include a sensor that is positioned within an appliance that is being monitored or controlled. However, none of these references provide a system for monitoring an appliance from a remote location.

SUMMARY OF THE INVENTION

The present invention provides a system for monitoring a function of an appliance. The system includes a main circuit panel having a circuit breaker switch with a first wire and a second wire to connect the circuit breaker switch to a circuit within an establishment. The system also includes a core surrounding the first wire, a sense-wire wound on the core; and a processor connected to the sense-wire. The processor monitors a phase relationship between the AC voltage and AC current of an appliance connected to the first and second wires and to determine information relating to the function of the appliance based on the phase relationship.

In one embodiment, the first wire may be a neutral wire and the second wire is a hot wire. In another embodiment, the first wire may be a hot wire and the second wire is a neutral wire.

In yet another embodiment, the system may also include a resistor connected to the processor in series with the core and a low pass filter connected to the processor in parallel with the core.

In another aspect, the present invention provides a system for monitoring a function of an appliance including a circuit breaker switch, a core transformer, and a processor. The circuit breaker switch has a first wire and a second wire to connect the circuit breaker switch to a circuit within an establishment. The core transformer has a primary winding that includes a portion of the first wire to detect a current polarity change in the first wire. The core transformer also has a secondary winding at which an electrical signal is generated upon detection of the polarity change. The processor is then connected to the secondary winding and configured to monitor the electrical signal and to determine diagnostic information of the appliance connected to the circuit breaker switch based on the electrical signal.

In yet another aspect, the present invention provides a system for monitoring a function of an appliance, where the system includes a plurality of circuit breaker switches, a plurality of cores, a multiplexer, and a processor. Each of the plurality of circuit breaker switches has a first wire and a second wire to connect the circuit breaker switch to a circuit within an establishment. Each of the plurality of cores then has a primary winding that includes a portion of a separate one of the first wires to detect a current polarity change in such first wire. Each of the cores also has a secondary winding at which an electrical signal is generated upon detection of the polarity change. The multiplexer is then connected to the secondary winding of each of the plurality of cores, and the processor is connected to the multiplexer to monitor the phase relationship between an AC voltage an AC current of an appliance connected to at least one of plurality of circuit breaker switches and to determine information relating to the function of the appliance based on the phase relationship.

In yet another aspect, the present invention provides a method for remotely detecting functionality of an appliance comprising the steps of providing a circuit breaker switch having a first wire and a second wire to connect the circuit breaker switch to a circuit within an establishment; surrounding the first wire with a core; winding a sense-n wire on the core; monitoring a phase relationship between an AC voltage an AC current of an appliance connected to the circuit breaker switch via electrical signals on the sense-wire; and determining a function of the appliance based on the phase relationship.

DETAILED DESCRIPTION OF THE PREFERRED EMBODIMENT

Figure 1:
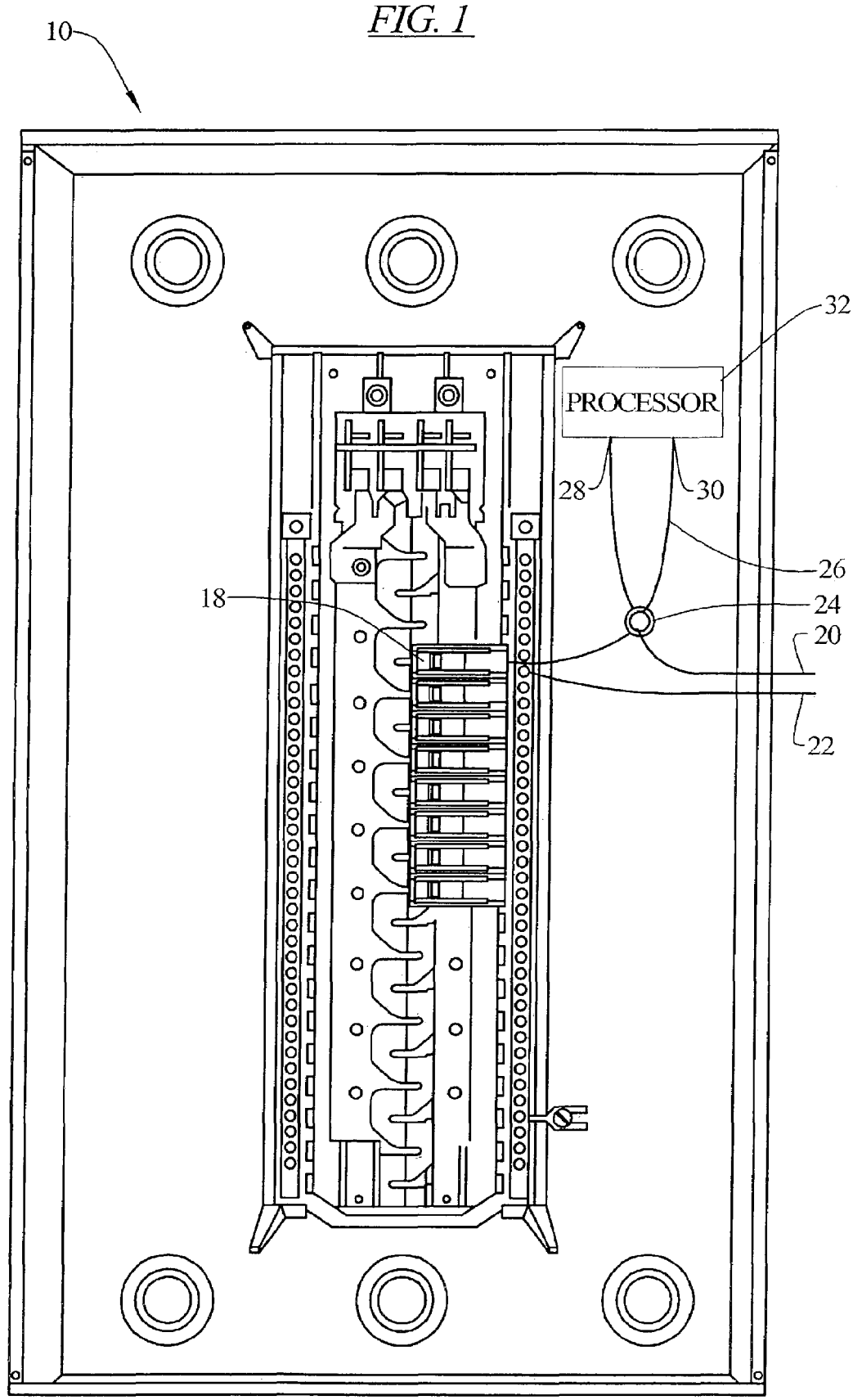
FIG. 1 is a schematic diagram of one embodiment of the present invention.

The present invention is a system and method for remotely monitoring functionality of an appliance in a residential, commercial or industrial establishment. FIG. 1 shows one embodiment of the present invention used in combination with a main circuit panel 10 for a house. The main circuit panel 10 may include a main breaker switch 12, a neutral or grounding bus 14, and a hot bus 16. The main circuit panel 10 also includes a plurality of circuit breaker switches 18. Each circuit breaker switch 18 leads to a particular branch circuit in the house and includes a neutral wire 20 and a hot wire 22. For example, one circuit breaker switch may be connected to the outlets in the living room, and another might be connected to all of the downstairs lighting. Appliances, such as a central air conditioning system or a refrigerator may also be connected to their own circuit breaker switch.

In an arrangement, each circuit to be monitored by use of a core is dedicated to a single appliance. In this way, superimposed signals due to simultaneous operation of more than one appliance on a circuit are avoided.

In one embodiment, the neutral wire 20 from the circuit breaker switch 18 is surrounded by a core 24 such that the neutral wire 20 provides a primary winding on the core. Preferably, the core 24 is a small, saturating ferrite transformer having no cut air gaps or mechanism clamp hinges. Examples are a high-density manganese ferrite core such as part numbers 5985015601, 5985001101 and 5985001801 manufactured by Fair-Rite Products Corporation which have been found to be appropriate for 15/20 amp single-pole circuit breakers, 30/40/50 amp double-pole circuit breakers and 200 amp entry wires respectively. Alternatively, the sensor 24 may also be either a small tape wound core having a metal alloy with a high nickel content or a current transformer. While multi-turn primary windings can be used a more cost effective installation involves the smallest diameter ferrite core which will slip like a bead over the branch wire insulation leaving sufficient room for a single-turn secondary winding.

In an alternative embodiment, the primary winding may be comprised of the hot wire 22 from the circuit breaker instead of the return wire 20 to the neutral bus. This serves to avoid confusion regarding identification of the branch and may allow an electrician installing the present invention to cut hot and neutral wires to different lengths. In addition, some appliances such as central air conditioners and 240 VAC well pumps include double-pole branch circuits that require a sensor on the hot wire since there is no neutral wire.

A sense-wire 26 is wound on the core 24 to provide a secondary winding, and is connected to a processor 32 via electrical leads 28 and 30. For a current transformer the sense-winding is typically several hundred turns. However, the preferred ferrite sense-winding is only a single-turn.

As taught in U.S. Pat. Nos. 4,481,786; 5,006,778; 5,101,575; 5,130,624; 5,038,091; 5,166,592; 5,237,256; 5,280,227; 5,281,956; and 5,564,831, each of which is incorporated herein by reference, the core is used to monitor the phase relationship between the AC voltage and current for each half cycle of the AC signal. More specifically, the core 24 is responsive to polarity changes with zero crossings of the current on the primary winding. All of the magnetic flux in the small core 24 changes direction shortly after the primary winding current changes polarity. A brief voltage spike is generated in the secondary winding upon each polarity change of the main run winding current. In accordance with Faraday's Law of voltage induction, the electromotive force which is generated across the secondary winding is proportional to the rate of change of the magnetic flux of the core 24. The core 24 quickly saturates following each primary winding current zero crossing. Thus, alternating positive and negative voltage spikes are generated during each half cycle of the AC current. The core 20 thus operates as a small, continuous, quickly saturating nonlinear device which directly responds to the AC primary current zero crossings with a sequence of alternating positive and negative voltage spikes.

The alternating positive and negative voltage spikes generated on the secondary winding are then received by the processor 32. The processor monitors the voltage spike to determine the phase relationship between the AC voltage and AC current of an appliance connected to the circuit breaker switch, as described in greater detail in the previously cited patents. The phase relationship data may then be used by the processor to determine information relating to functionality of the appliance connected to the branch circuit.

For example, the processor may include diagnostics software to infer the motor start or acceleration time, a stalled motor condition, the torque being applied by a motor, and whether the torque being applied is changing over time. With respect to a washing machine, the diagnostics software may also discriminate between various cycles in a washing machine such as the agitate period, the neutral drain period, and the spin period. This information may then be used to follow the washing machine through a cycle sequence and to time the duration of each sub-cycle. The diagnostics software may also be able to determine whether the washer is over-loaded during agitation or off-balance during spin-extraction.

In a domestic clothes dryer the motor current appears at the neutral wire and the heater current appears at the 240/208 VAC double-pole breaker. Thus it becomes possible for remote diagnostics to discriminate between motor operation and heater element ON/OFF cycling. The preferred approach for the present invention associated with a clothes dryer includes two different ferrite sensors, one on the neutral wire and the other on a hot wire carrying heater (or heater plus motor) current. An alternative, but less sensitive approach, may include only a single ferrite surrounding the hot wire carrying heater (or heater plus motor) current may also be used. Diagnostics software may then discriminate between a 240/208 VAC service, infer the motor start time, maintain a cumulative count of heater thermostat cyclings and detect whether and when the clothes have become dry. Additional diagnostic software may also infer a broken belt or an empty drum. A blocked air-flow condition may also be inferred by an unusually high thermostat cycle count.

With respect to refrigerators, the remote diagnostics software may also infer the compressor dome temperature each time that the compressor starts. This is accomplished by processing a characteristic phase transition which occurs when a positive temperature coefficient of resistance start relay (PTCR) wired in parallel with the compressor motor run capacitor has heated beyond its transition or Currie temperature. There is a transient dip in the phase lag of the total appliance current when the parallel combination of the PTCR relay and motor capacitor transition from mostly resistive to mostly reactive as the PTCR element heats past the Currie temperature. This start relay heat time is inversely related to the compressor dome temperature provided that the compressor has been cycled OFF sufficiently long for the ceramic PTCR relay to assume approximately the same temperature as the compressor dome. Most domestic refrigerators use a single-piston-reciprocating compressor with a 2-pole capacitor-run motor. Once such a compressor motor has started, separate processing of phase data from odd and even AC half cycles may reveal rhythmicity corresponding to the compressor motor slip RPM, which is inversely related to the compressor torque. Both compressor dome temperature and slip RPM parameters are available from a remote processing of the total branch circuit phase lag even in the presence of other loads such as a relatively constant condenser fan motor load.

Dishwasher branch-circuit diagnostics software may discriminate between wash pump motor and heater loads. Thus remote software can follow the progression of a machine cycle. Depending upon the type of wash pump motor (PSC or split-phase) and whether the motor is operating during the water fill portion of each sub-cycle, it may also be possible to infer proper fill and soils which cause excessive water aeration.

Most domestic appliance manufacturers offer a vertical-axis agitator washer with a reversing transmission. During clothes load agitation the torque load as seen by the drive motor oscillates between minimum and maximum values as the transmission traverses each clockwise and counterclockwise stroke. Specifically the motor load is a minimum during agitation hesitation and a maximum during each mid-stroke, and the total branch circuit phase lag is a maximum during hesitation and a minimum during mid-stroke. This information may be processed to monitor both the average agitator mid-stroke torque and the precise stroke rate. Since each manufacturer uses a unique gear ratio it is also possible to infer both the manufacturer and the motor speed (4-, 6- or 8-pole active motor winding) from precise knowledge of the stroke rate. Unlike the above compressor motor slip RPM measurement, washer agitator torque rhythmicity does not require separation of odd and even AC phase-lag data. Hence a sure means exists to avoid confusing washer and refrigeration (compressor) branch circuit data from a remote location even if the installer/electrician mis-identifies a branch circuit.

Various circuits and algorithms for determining the functionality discussed above, as well as other functionality of various appliances, are described in U.S. Pat. Nos. 4,481,786; 5,006,778; 5,101,575; 5,130,624; 5,038,091; 5,166,592; 5,237,256; 5,280,227; 5,281,956; and 5,564,831.

Figure 2:
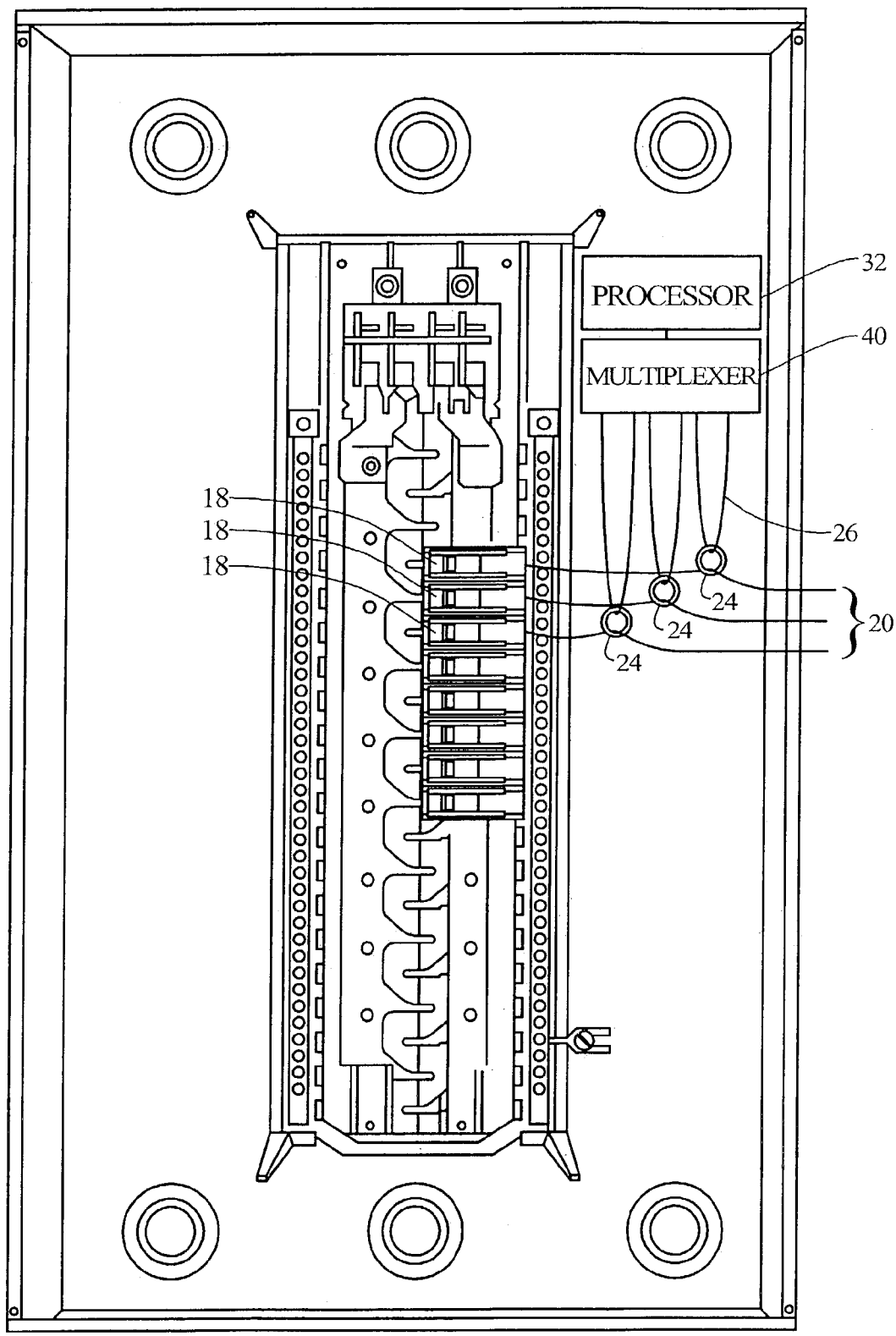
FIG. 2 is a schematic diagram of another embodiment of the present invention.

In another embodiment shown in FIG. 2, a plurality of circuit breaker switches may each be connected to a core 24 as discussed above. The secondary winding of each core is connected to a multiplexer 40 which is in turn connected to the processor 32. In one approach, the multiplexer 40 may be a multi-channel analog multiplexer circuit such as National Semiconductor MM74HC4051.

The multiplexer 40 may be controlled by the processor 32 to select one of the branch circuits and to feed the signal from the sense-wire 20 associated with the selected branch circuit to the processor 32. As such, the processor is capable of periodically monitoring information from various appliances connected to different branch circuits. In this way, a smaller number of processors or preferably a single processor may be utilized to monitor a plurality of appliances, with each processor now being capable of monitoring 8 or more circuits. The overall cost of a monitoring system for the appliances in an establishment, such as a home, is thereby reduced considerably.

Additionally, the processor may include means for determining the type of appliance connected to each individual branch circuit. In one embodiment, the processor may simply include functionality to automatically determine which appliance is connected to each individual branch circuit based on the phase relationship of the AC current and the AC voltage. Alternatively, the processor may be connected to a user interface, selectable buttons, dip-switches, or any other type of controls, that allow a user to manually select the specific appliance connected to the branch circuit.

Figure 3:
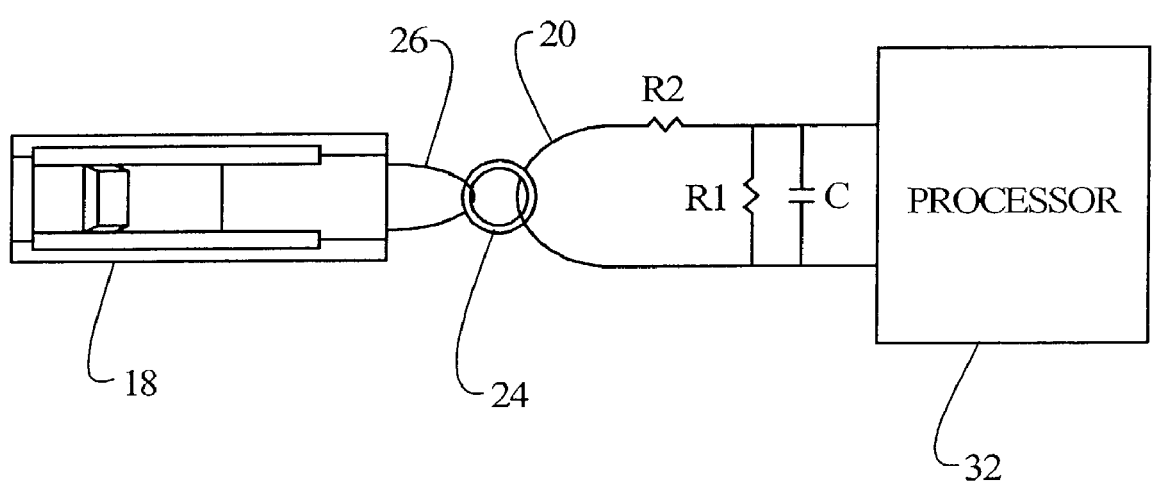
FIG. 3 is a circuit diagram of another embodiment of the present invention.

As shown in FIG. 3, a low-pass filter may also be connected to the core 24 to reduce electrical noise from the branch circuit. In one embodiment, the low-pass filter may include a resistor R1 and a capacitor C connected in parallel. Resistor $R_2$ may also be connected in series to one of the leads 28 or 30 of the sense-wire. The series combination of resistors R1 and R2 are selected to provide sufficient current to prevent oxidation of contacts should the sense-wire signals be brought to the multiplex circuit via a connector. In one approach, R1 is a 10 ohm resistor, R1 is a 4.7 ohm resistor, and C is a 1 uF capacitor. As a result, the typical peak current on the secondary winding is approximately 23 milliamperes, which is sufficient to prevent oxidation of the contacts. If the system includes a multiplexer, the single low-pass filter may alternatively be connected between the multiplexer and the processor in order to avoid having a separate low pass filter for each core 24.

The information determined by the processor for each appliance may be stored in the processor such that the information may be accessed by a user or a technician to determine whether any of the appliances require maintenance. Accordingly, the processor may include an output capable of being connected to a user interface that allows a user to access the information stored in the processor.

Figure 4:
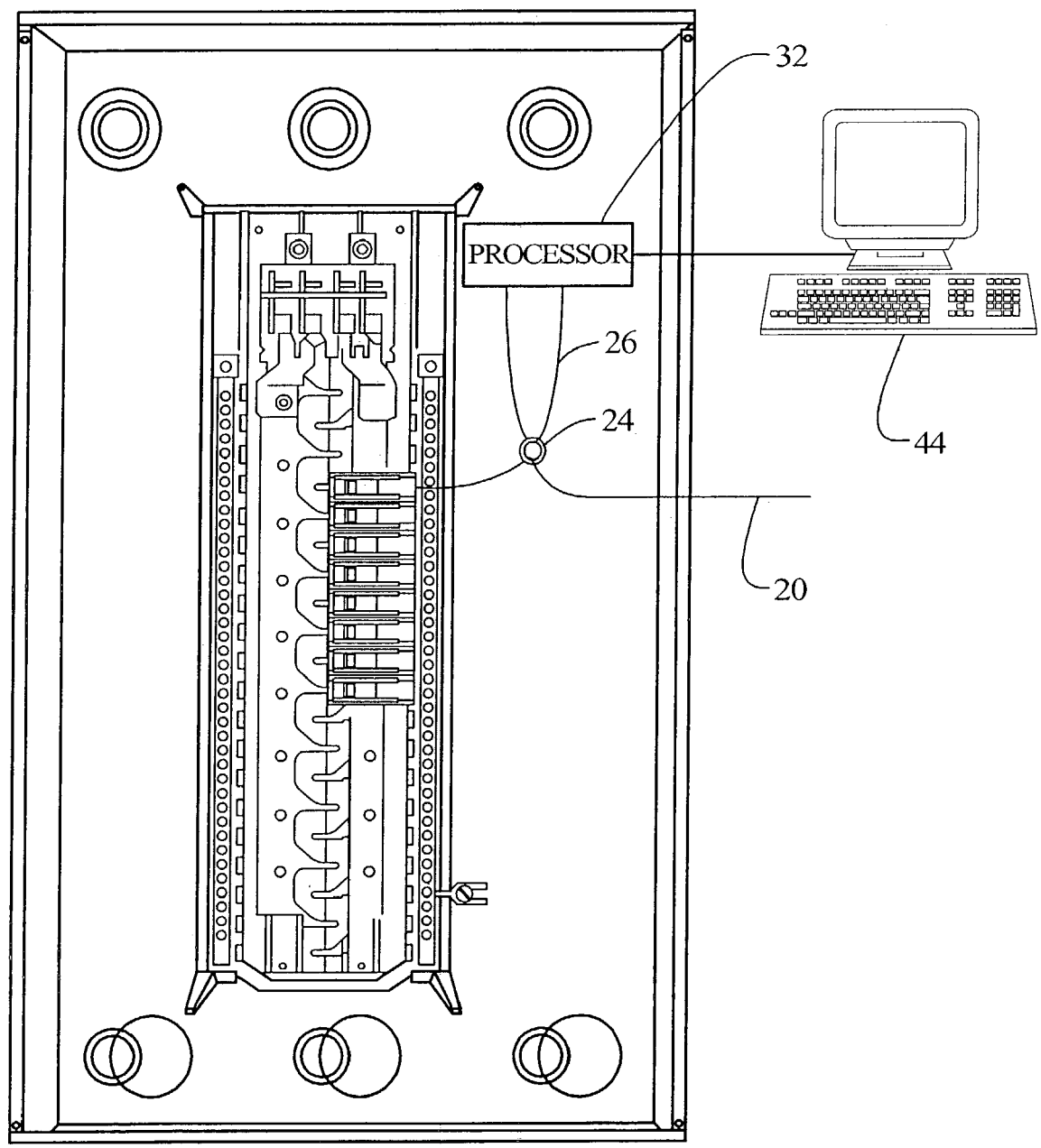
FIG. 4 is a schematic diagram of another embodiment of the present invention that is connected to a computer.

In another embodiment shown in FIG. 4, the processor may be connected to a computer 44. Accordingly, diagnostic information determined by the processor may be transmitted to the computer and stored such that a user may able to access the information.

Figure 5:
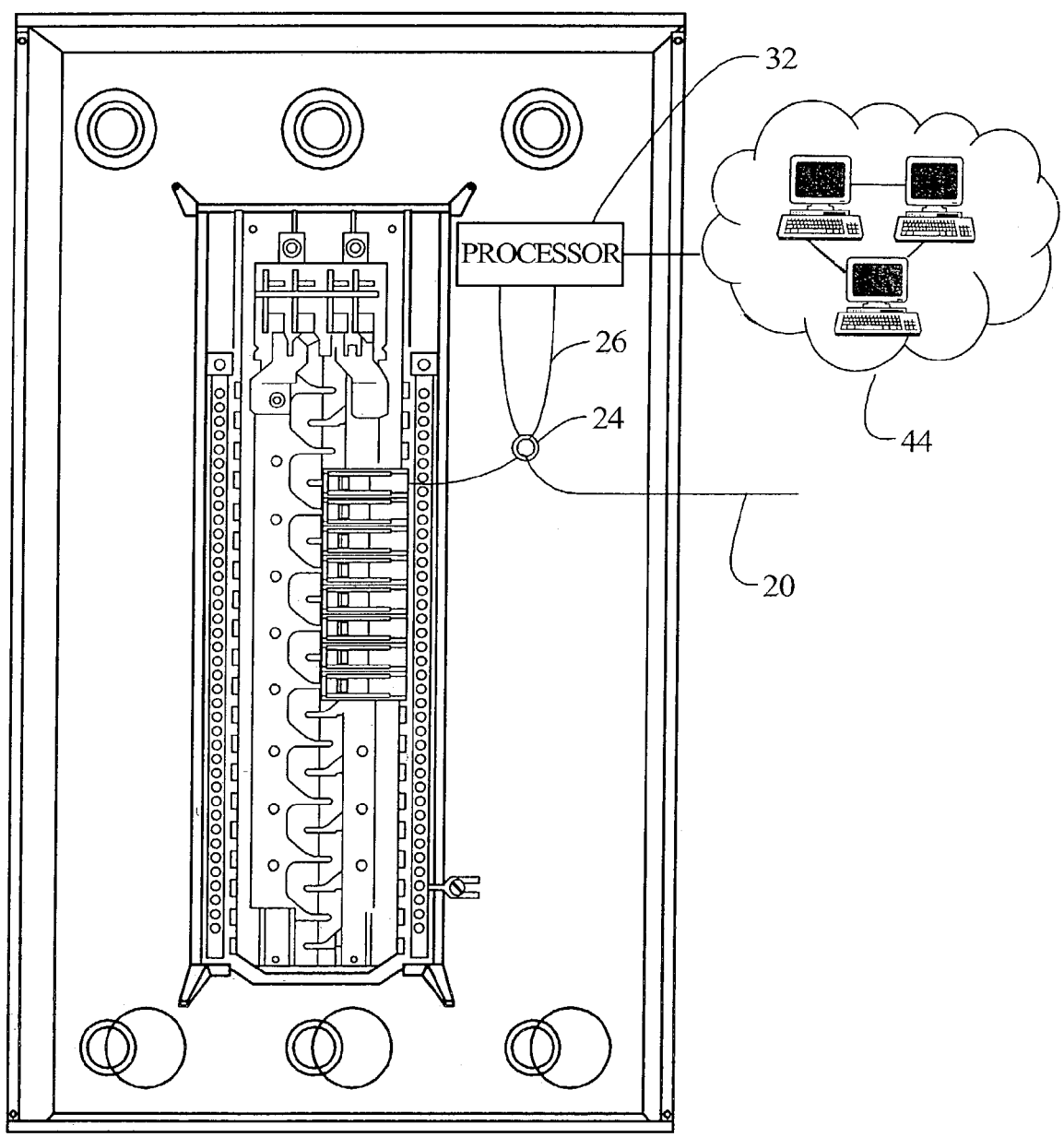
FIG. 5 is a schematic diagram of another embodiment of the present invention having an internet connection.

In yet another embodiment shown in FIG. 5, the processor may be connected to a communication line such a telephone line, DSL, or cable, to transmit diagnostic information determined by the processor over the internet 46 to an internet server or a home security provider. Accordingly, the functionality and operation of the appliances in an establishment may then be monitored, by either the user or a third party, from a remote location outside the home. In addition, the processor may also be capable of downloading updates to the diagnostics software via the communication line.

As is apparent from the foregoing specification, the invention is susceptible of being embodied with various alterations and modifications which may differ particularly from those that have been described in the preceding specification and description. It should be understood that we wish to embody within the scope of the patent warranted hereon all such modifications as reasonably and properly come within the scope of our contribution to the art.

What is claimed is:

1. A system for remotely monitoring a function of an appliance comprising:
    a household circuit panel including a circuit breaker switch having a first wire and a second wire to connect the circuit breaker switch to a circuit within an establishment;
    a core surrounding the first wire;
    a sense-wire wound on the core; and
    a processor connected to the sense-wire to remotely monitor a phase relationship between an AC voltage and AC current of an appliance connected to the first and second wires and to remotely determine information relating to the function of the appliance based on the phase relationship.

2. The system of claim 1 wherein the first wire is a neutral wire.

3. The system of claim 1 wherein the first wire is a hot wire.

4. The system of claim 1 further including a resistor connected to the processor in series with the core.

5. The system of claim 4 further including a low pass filter connected to the processor in parallel with the core.

6. The system of claim 1 wherein the appliance is a dryer.

7. The system of claim 6 wherein the processor includes diagnostics software to discriminate between a 240 VAC and a 208VAC electrical signal.

8. The system of claim 6 wherein the processor includes diagnostics software to determine a motor start time of the dryer.

9. The system of claim 6 wherein the processor includes diagnostics software to maintain a cumulative count of heater thermostat cyclings.

10. The system of claim 1 wherein the appliance is a refrigerator.

11. The system of claim 10 wherein the processor includes diagnostics software to monitor a positive temperature coefficient of resistance of a start relay, and to infer a compressor dome temperature based on a PTCR start relay heat time.

12. The system of claim 10 wherein the processor includes diagnostics software to monitor compressor motor slip RPM, and to determine a compressor torque based on the motor slip RPM.

13. The system of claim 1 wherein the appliance is a vertical-axis washer with a reversing transmission.

14. The system of claim 13 wherein the processor includes diagnostics software to monitor a stroke rate of a washer motor, and to determine a manufacturer of the washer based on the stroke rate.

15. A system for remotely monitoring a function of an appliance comprising:
    a circuit breaker switch having a first wire and a second wire to connect the circuit breaker switch to a circuit within an establishment;
    a core transformer having a primary winding including a portion of the first wire and having a secondary winding at which an electrical signal is generated in response to a polarity change in the first wire; and
    a processor connected to the secondary winding and configured to remotely monitor the electrical signal and to remotely determine diagnostic information of the appliance connected to the circuit breaker switch based on the electrical signal.

16. The system of claim 15 wherein the first wire is a neutral wire.

17. The system of claim 15 wherein the first wire is a hot wire.

18. The system of claim 15 further including a resistor connected to the processor in series with the core.

19. The system of claim 18 further including a low pass filter connected to the processor in parallel with the core.

20. A system for remotely monitoring a function of an appliance comprising:
    a plurality of circuit breaker switches, each of the plurality of circuit breaker switches having a first wire and a second wire to connect the circuit breaker switch to a circuit within an establishment;
    a plurality of cores, each of the plurality of cores having a primary winding including a portion of a separate one of the first wire and having a secondary winding at which an electrical signal is generated in response to a polarity change in the first wire; and
    a multiplexer connected to the secondary winding of each of the plurality of cores; and
    a processor connected to the multiplexer to remotely monitor the phase relationship between an AC voltage an AC current of an appliance connected to at least one of plurality of circuit breaker switches and to remotely determine information relating to the function of the appliance based on the phase relationship.

21. The system of claim 20 wherein the first wire is a neutral wire.

22. The system of claim 20 wherein the first wire is a hot wire.

23. The system of claim 20 further including a resistor connected to the processor in series with the core.

24. The system of claim 23 further including a low pass filter connected to the processor in parallel with the core.

25. The system of claim 24 wherein the low pass filter is connected between each one of plurality of cores and the multiplexer.

26. The system of claim 24 wherein the low pass filter is connected between the multiplexer and the processor.

27. A method for remotely detecting functionality of an appliance comprising:
providing a circuit breaker switch having a first wire and a second wire to connect the circuit breaker switch to a circuit within an establishment;
surrounding the first wire with a core;
winding a sense-wire on the core;
remotely monitoring a phase relationship between an AC voltage an AC current of an appliance connected to the circuit breaker switch via electrical signals on the sense-wire;
remotely determining a function of the appliance based on the phase relationship.

28. The system of claim 27 wherein the first wire is a neutral wire.

29. The system of claim 27 wherein the first wire is a hot wire.

30. A system for remotely monitoring a function of a plurality of appliances comprising:
a plurality of electrical circuits, each of the plurality of circuits having a first wire and a second wire leading to an appliance within an establishment
a plurality of cores, each of the plurality of cores surrounding one of the first wires of each circuit and having a secondary winding at which an electrical signal is generated in response to a polarity change in the first wire;
a multiplexer connected to the secondary winding of each of the plurality of cores; and
a processor connected to the multiplexer to remotely monitor the phase relationship between an AC voltage an AC current of each appliance connected to one of the plurality of circuits and to remotely determine information relating to the function of the appliance based on the phase relationship.

31. A device for remotely monitoring a plurality of appliances, wherein each appliance is connected to an electrical circuit having a first wire and a second wire, comprising:
a plurality of cores, each of the plurality of cores constructed to be able to surround one of the first wires of each circuit and having a secondary winding at which an electrical signal is generated in response to a polarity change in the first wire,
a multiplexer connected to the secondary winding of each of the plurality of cores; and
a processor connected to the multiplexer to remotely monitor the phase relationship between an AC voltage an AC current of each appliance connected to one of the plurality of circuits and to remotely determine information relating to the function of the appliance based on the phase relationship.

* * * * *